(12) United States Patent
Chang et al.

(10) Patent No.: US 7,317,615 B2
(45) Date of Patent: Jan. 8, 2008

(54) INTEGRATED CIRCUIT COOLANT MICROCHANNEL ASSEMBLY WITH MANIFOLD MEMBER THAT FACILITATES COOLANT LINE ATTACHMENT

(75) Inventors: Je-Young Chang, Phoenix, AZ (US); Gregory M. Chrysler, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 213 days.

(21) Appl. No.: 11/135,530

(22) Filed: May 23, 2005

(65) Prior Publication Data

US 2006/0262502 A1 Nov. 23, 2006

(51) Int. Cl.
*H05K 7/20* (2006.01)
*H01L 23/34* (2006.01)
*F28F 7/00* (2006.01)

(52) U.S. Cl. ............... 361/699; 257/714; 174/15.1; 174/15.2; 165/80.4; 165/80.5

(58) Field of Classification Search ......... 361/699, 361/700–702; 257/714; 174/15.1, 15.2; 165/80.4, 80.5, 104.33
See application file for complete search history.

(56) References Cited

U.S. PATENT DOCUMENTS

| | | | | |
|---|---|---|---|---|
| 5,099,311 | A * | 3/1992 | Bonde et al. | 165/80.4 |
| 5,514,906 | A * | 5/1996 | Love et al. | 257/712 |
| 6,351,384 | B1 * | 2/2002 | Daikoku et al. | 361/704 |
| 7,123,479 | B2 * | 10/2006 | Chang et al. | 361/700 |
| 2003/0041652 | A1 * | 3/2003 | Spaid et al. | 73/54.05 |
| 2004/0089422 | A1 * | 5/2004 | Cavalotti et al. | 156/405.1 |
| 2005/0024212 | A1 * | 2/2005 | Hultzsch | 340/575 |
| 2005/0122688 | A1 * | 6/2005 | Chang et al. | 361/704 |
| 2005/0200001 | A1 * | 9/2005 | Joshi et al. | 257/712 |
| 2005/0269061 | A1 * | 12/2005 | Brewer et al. | 165/80.4 |
| 2005/0279491 | A1 * | 12/2005 | Thome et al. | 165/272 |
| 2006/0071326 | A1 * | 4/2006 | Chrysler et al. | 257/714 |
| 2006/0126308 | A1 * | 6/2006 | Campbell et al. | 361/719 |
| 2006/0196646 | A1 | 9/2006 | Myers et al. | |
| 2007/0050980 | A1 * | 3/2007 | Vetter | 29/890.043 |

* cited by examiner

*Primary Examiner*—Jayprakash Gandhi
*Assistant Examiner*—Zachary M Pape
(74) *Attorney, Agent, or Firm*—Buckley, Maschoff & Talwalkar LLC

(57) ABSTRACT

An apparatus includes a microchannel structure having microchannels formed therein. The microchannels are to transport a coolant and to be proximate to an integrated circuit to transfer heat from the integrated circuit to the coolant. The apparatus also includes a plurality of walls coupled to the microchannel structure to define a manifold. The manifold is in communication with at least a plurality of the microchannels. The plurality of walls includes a side wall. The side wall has a port therein. The port allows the coolant to flow in a direction that is either into the manifold or out of the manifold.

7 Claims, 5 Drawing Sheets

INTEGRATED CIRCUIT COOLANT MICROCHANNEL ASSEMBLY WITH MANIFOLD MEMBER THAT FACILITATES COOLANT LINE ATTACHMENT

BACKGROUND

As microprocessors advance in complexity and operating rate, the heat generated in microprocessors during operation increases and the demands on cooling systems for microprocessors also escalate. It has been proposed to cool microprocessors with cooling systems that circulate a liquid coolant through a microchannel cold plate that is thermally coupled to the microprocessor die. One issue that may be encountered in microchannel cooling systems is potential difficulty in connecting tubes for the coolant path to the potentially delicate cover of a microchannel assembly. Techniques have been proposed for attaching fittings for coolant tubes to the microchannel assembly cover, but this technique may not be suitable for application to high volume manufacturing of microchannel cooling systems.

DETAILED DESCRIPTION

Figure 1:
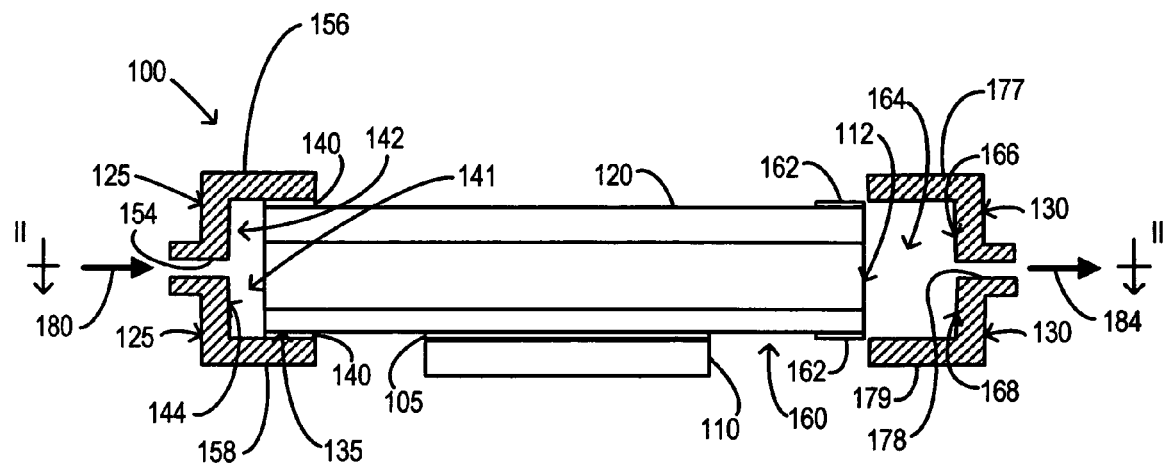
FIG. 1 is a partially exploded schematic vertical cross-sectional view of a microchannel assembly according to some embodiments.
Figure 2:
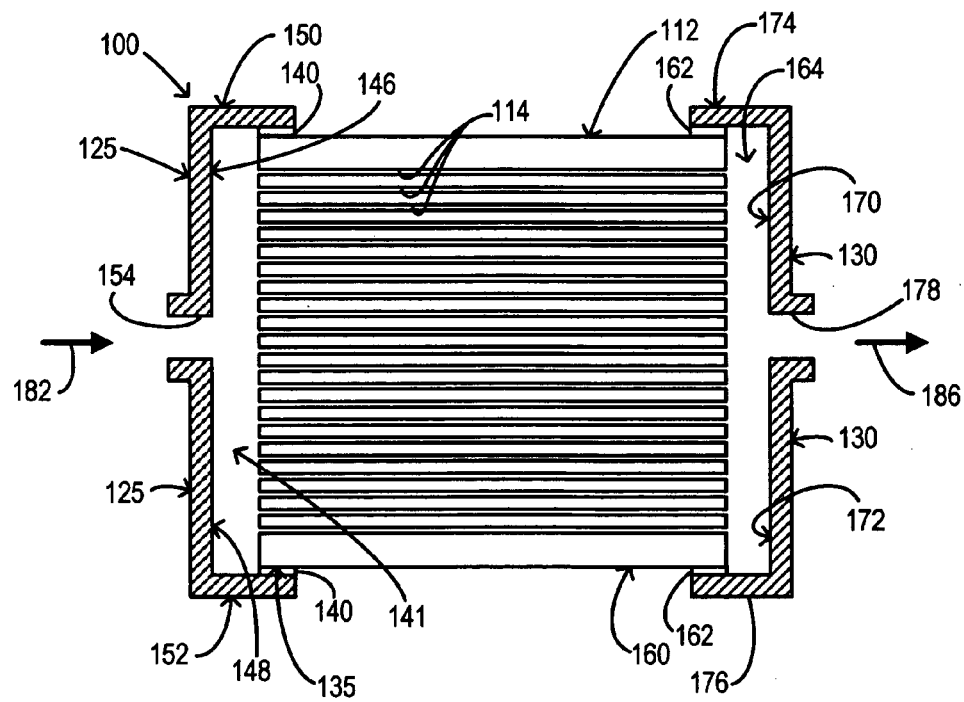
FIG. 2 is a schematic horizontal cross-sectional view of the microchannel assembly, taken at line II-II in FIG. 1.

FIG. 1 is a partially exploded schematic vertical cross-sectional view showing a microchannel assembly 100 according to some embodiments, thermally coupled via a thermal interface material (TIM) 105 to an Integrated Circuit (IC) 110. FIG. 2 is a schematic horizontal cross-sectional view of the microchannel assembly 100, taken at line II-II in FIG. 1. The IC 110 may be associated with, for example, an INTEL® PENTIUM IV processor.

The microchannel assembly 100 includes a microchannel structure 112 having microchannels 114 (FIG. 2) formed therein. The microchannels 114 are channels or passages each having a width of about 20 to 500 micrometers, although other widths may be used. The microchannels 114 transport (e.g., allow to flow therein) a coolant (not shown). The microchannel structure 112 may be any body, such as a metal or silicon cold plate in which microchannels are formed and which is to be mounted on the back-side of a microchip such as the IC 110 so that the microchannels are proximate to the IC to transfer heat from the IC to the coolant. The IC 110 may be thinned to reduce thermal resistance between the transistors and the microchannels. The microchannel structure 112 may alternatively be the microchip die itself having microchannels formed in a rear surface thereof.

In some embodiments, the microchannels 114 may have a height of about 300 microns and a width of about 100 microns, but other dimensions of the microchannels 114 are possible. In a practical embodiment, the number of microchannels may be much more than the relatively few microchannels depicted in the drawing. The microchannels may, but need not, all be straight and parallel to each other. In general, FIGS. 1 and 2 and the other drawings herein are not to scale.

The microchannel assembly 100 also includes a lid or cover 120 (FIG. 1) that effectively closes the top of the microchannels 114 formed in the microchannel structure 112.

The microchannel assembly 100 further includes an inlet manifold member 125 and an outlet manifold member 130. The inlet manifold member 125 is coupled to a front end 135 of the microchannel structure 112 and also to the corresponding end of the lid 120. The coupling of the inlet manifold member 125 to the microchannel structure and lid may be done by a liquid-tight sealing arrangement 140, such as an O-ring, solder or an epoxy adhesive.

The inlet manifold member 125 includes a plurality of walls to define an inlet manifold 141 at the front end 135 of the microchannel structure 112. The inlet manifold is in communication with all of the microchannels 114. The plurality of walls that constitute the inlet manifold member 125 includes a main side wall indicated at 142, 144 in FIG. 1 and at 146, 148 in FIG. 2. The plurality of walls also includes a left side wall 150 and a right side wall 152. It will be understood that all of the main side wall, the left side wall and the right side wall are to be considered "vertical walls", where the vertical direction (as seen in FIG. 1) is the direction from the microchannel structure 112 to the IC 110.

The main side wall has an inlet port 154 formed therein (e.g., at a central location in the main side wall) to allow coolant (not shown) to flow into the inlet manifold 141. The inlet port 154 may be integrally formed in the main side wall, or may be formed by molding the main side wall around a suitable fitting, which is not separately shown. The inlet port 154 may be configured to facilitate connection of a coolant line (not shown in FIGS. 1 and 2) which transports coolant from a pump (not shown) to the microchannel assembly 100.

The inlet manifold member 125 also includes a top wall 156 (FIG. 1) and a bottom wall 158, which are horizontal walls.

In some embodiments, the inlet manifold member may be formed as a single unitary body, formed for example of a metal such as copper, or silicon or molded plastic.

The outlet manifold member 130 is shown separately from the microchannel structure 122 in FIG. 1 for purposes of illustration, but in practice may be coupled to the rear end 160 of the microchannel structure 122, as shown in FIG. 2. The outlet manifold member is also coupled to the lid 120. The same sort of sealing arrangement (indicated at 162) may be employed for the outlet manifold member as was described above in connection with the inlet manifold member. In some embodiments, the outlet manifold member may be a mirror image of the inlet manifold member, or even identical in form to the inlet manifold member.

The outlet manifold member 130 includes a plurality of walls to define an outlet manifold 164 at the rear end 160 of the microchannel structure 112. The outlet manifold is in communication with all of the microchannels 114. The plurality of walls that constitute the outlet manifold member 130 includes a main side wall indicated at 166, 168 in FIG. 1 and at 170, 172 in FIG. 2. The plurality of walls that constitute the outlet manifold member 130 also includes a left side wall 174 and a right side wall 176. The main side wall and right and left side walls of the outlet manifold member 130 are all vertical walls.

The main side wall of the outlet manifold member 130 has an outlet port 178 formed therein (e.g., at a central location in the main side wall) to allow coolant to flow out of the outlet manifold 164. The outlet port 178 may be configured to facilitate connection of a coolant line (not shown in FIGS. 1 and 2) which transports coolant from the microchannel assembly 100 to the pump that was mentioned above.

The outlet manifold member 130 also includes a top wall 177 and a bottom wall 179, which are horizontal walls.

As was indicated with respect to the inlet manifold member, the outlet manifold member may be formed as a single unitary body. The outlet manifold member may, but need not, be formed of the same material as the inlet manifold member.

In operation, a pump (which is not shown) may pump a liquid coolant (not shown) through an inflow coolant line (not shown) that is coupled to the inlet port 154. The coolant may flow through the inlet port in the direction indicated by arrows 180 (FIG. 1) and 182 (FIG. 2) into the inlet manifold 125. It will be recognized that the direction indicated by arrows 180, 182 is a horizontal direction that is parallel to the length dimension of the microchannels 114. The coolant is distributed by the inlet manifold 125 among the microchannels 114 and flows out of the inlet manifold 125 into the microchannels 114 in the same direction indicated by the arrows 180, 182. The coolant flows through the microchannels 114 in the same direction indicated by the arrows 180, 182. While the coolant flows through the microchannels 114, heat generated by transistors (not separately shown) on the front side of the IC 110 is transferred through the TIM 105 and the microchannel structure 112 to the coolant, thereby heating the coolant. The heated coolant, still flowing in the direction indicated by the arrows 180, 182, flows out of the microchannels 114 and into the outlet manifold 130. Further, the coolant flows in the direction indicated by arrows 180, 182 out of the outlet manifold 130 via the outlet port 178, as further indicated by arrows 184 (FIG. 1) and 186 (FIG. 2). The coolant flows from the outlet port 178 to a heat exchanger (not shown) via an outflow coolant line (not shown) that is coupled to the outlet port 178. A fan (not shown) directs air flow through the heat exchanger to remove heat from the coolant, thereby cooling the coolant, which is then pumped back to the microchannel assembly 100.

To efficiently facilitate a transfer of heat, a coolant with a relatively high thermal conductivity and high heat capacity may be used. Moreover, it may be beneficial if the coolant is relatively inexpensive and easy to pump. Note that water has a relatively high thermal conductivity, a relatively high heat capacity, is relatively inexpensive, and can be readily pumped.

The manifold members 125, 130 may facilitate high volume manufacturing of the microchannel assembly 100 and the cooling system of which it is a part by conveniently providing ports to which the coolant circulation lines may be coupled.

Figure 3:
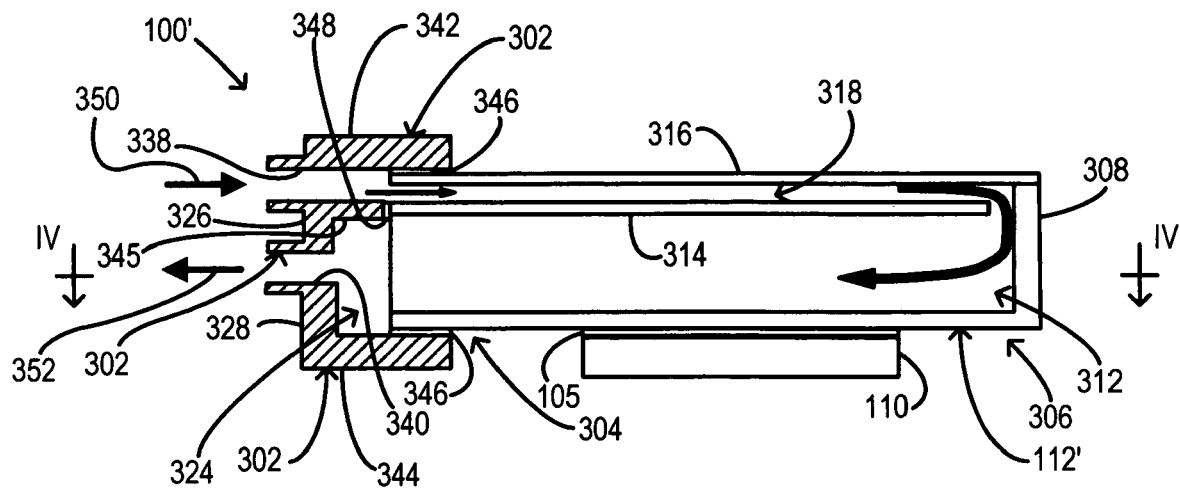
FIG. 3 is a view similar to FIG. 1 of a microchannel assembly according to some other embodiments.
Figure 4:
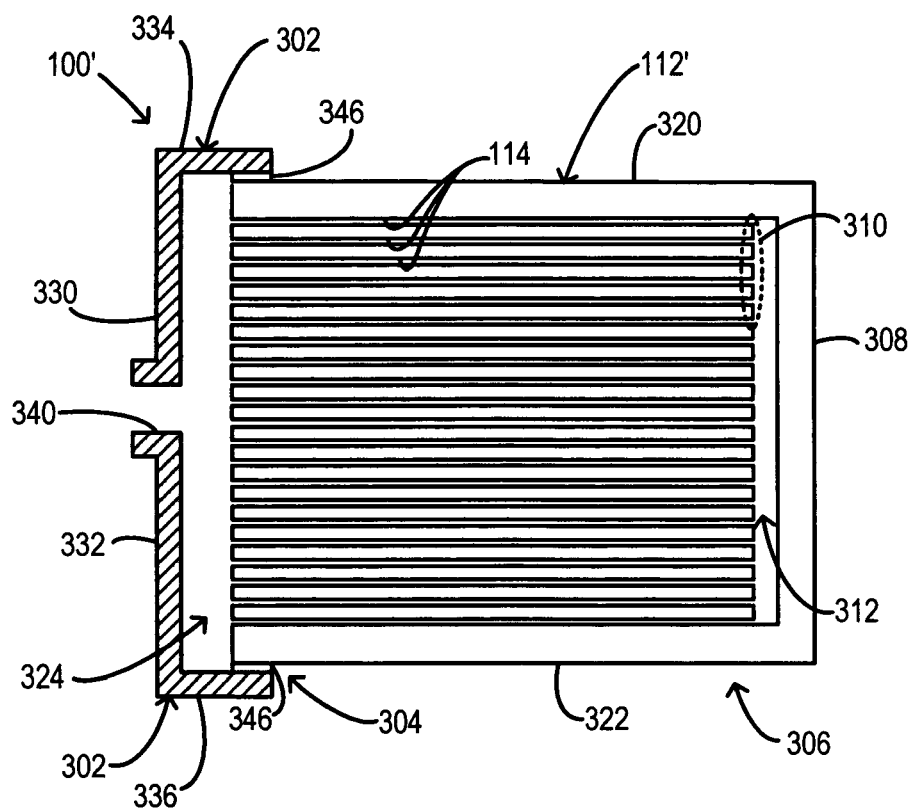
FIG. 4 is a schematic horizontal cross-sectional view of the microchannel assembly of FIG. 3, taken at line IV-IV in FIG. 3.

In other embodiments, illustrated in FIGS. 3 and 4, a modified microchannel assembly 100' has only one manifold member 302, coupled to a front end 304 of the microchannel structure 112', rather than the two manifold members coupled to opposite ends of the microchannel structure 112 as in the embodiments of FIGS. 1 and 2. In the microchannel structure 112' shown in FIGS. 3 and 4, the rear end 306 of the microchannel structure 112' is closed by a rear wall 308 of the microchannel structure 112'. The intake ends 310 of the microchannels 114 (as seen in FIG. 4) are spaced from the rear wall 308 so that an intake manifold 312 is formed between the rear wall 308 and the intake ends 310 of the microchannels 114. The intake manifold 312 is in communication with the microchannels 114.

The microchannel assembly 100' includes a lower lid 314 (FIG. 3) which is coupled to the microchannel structure 112' to close the tops of the microchannels 114. The microchannel assembly 100' also includes an upper lid 316 which is spaced above the lower lid 314 to form a coolant passage 318 between the lids 314, 316. The upper lid 316 is coupled to the rear wall 308 and the side walls 320, 322 (FIG. 4) of the microchannel structure 112' to close the top of the microchannel assembly 100'.

The manifold member 302 includes a plurality of walls to define an outlet manifold 324 at the front end 304 of the microchannel structure 112'. The outlet manifold 324 is in communication with all of the microchannels 114 of the microchannel structure 112'. The plurality of walls that constitute the manifold member 302 includes a main side wall indicated at 326, 328 in FIG. 3 and at 330, 332 in FIG. 4. The plurality of walls also includes a left side wall 334 and a right side wall 336. The main side wall and the left and right side walls are vertical walls.

The main side wall of the manifold member 302 has an inlet port 338 formed therein (e.g. at an upper central location in the main side wall) to allow coolant to flow into the passage 318 and via the passage 318 to the intake manifold 312 at the rear end 306 of the microchannel structure 112'. (It will be noted that the rear end 306 of the microchannel structure 112' is opposite to the front end 304 of the microchannel structure 112'.) The main side wall of the manifold 302 also has an outlet port 340 formed therein (e.g., at a central location in the main side wall) to allow coolant to flow out of the outlet manifold 324. Each of the inlet port 338 and the outlet port 340 may be integrally formed in the main side wall, or may be formed by molding the main side wall around a suitable fitting, which is not separately shown. The inlet port 338 may be configured to facilitate connection of a coolant line (not shown in FIG. 3) which transports coolant from a pump (not shown) to the microchannel assembly 100'. The outlet port 340 may be configured to facilitate connection of a coolant line (not shown in FIGS. 3 and 4) which transports coolant from the microchannel assembly 100' to the heat exchanger.

The manifold member 302 also includes a top wall 342 (FIG. 3) and a bottom wall 344, which are both horizontal walls, as well as a horizontal dividing wall 345 to isolate the inlet port 338 from the outlet port 340.

The manifold member 302 may be coupled to the microchannel structure 112' via liquid-tight sealing arrangements as indicated at 346 and 348. As in the previous embodiment, the sealing arrangement at 346 may be an O-ring, solder or an epoxy adhesive, for example. The sealing arrangement at 348 may, for example, be formed of solder or an epoxy adhesive.

In some embodiments, the manifold member 302 may be formed as a single unitary body, formed for example of a metal such as copper, or silicon or molded plastic.

The operation of a cooling system that includes the microchannel assembly 100' may be generally the same as the operation described above in regard to the microchannel assembly 100, except that the flow of coolant into, through and out of the microchannel assembly 100' is somewhat different. Referring to FIG. 3, the coolant flows through the inlet port 338 from the inflow coolant line (not shown) that is coupled to the inlet port 338. The flow of the coolant into the inlet port is in the horizontal direction indicated by arrow 350. The coolant continues to flow in the same direction from the front end 304 of the microchannel structure 112' to the rear end 306 of the microchannel structure 112' via the passage 318 which is above the microchannels 114 (FIG. 4). Continuing to refer to FIG. 3, the coolant flows from the passage 318 into the intake manifold 312 and from the intake manifold 312 into the intake ends 310 (FIG. 4) of the microchannels 114. The coolant flows through the microchannels 114 in a horizontal direction that is opposite to the direction indicated by arrow 350 (FIG. 3). The coolant flows out of the microchannels 114 and into the outlet manifold 324. From the outlet manifold 324, the coolant flows out of the outlet port 340, in the direction indicated by arrow 352, which is the same direction in which the coolant flowed from the intake manifold 312 into the microchannels 114, as well as through the microchannels 114 and into the outlet manifold 324. The coolant is transported away from the outlet port 340 via an outflow coolant line (not shown) that is coupled to the outlet port 340.

Figure 5:
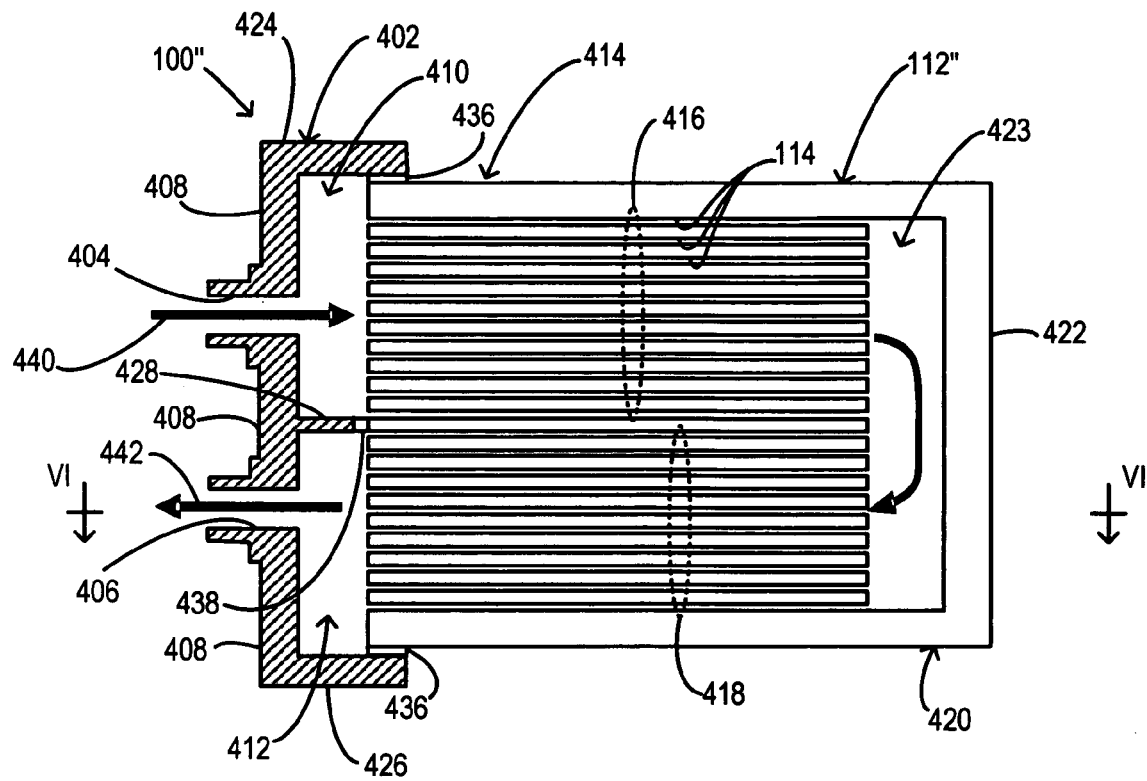
FIG. 5 is a schematic horizontal cross-sectional view of a microchannel assembly according to still other embodiments.
Figure 6:
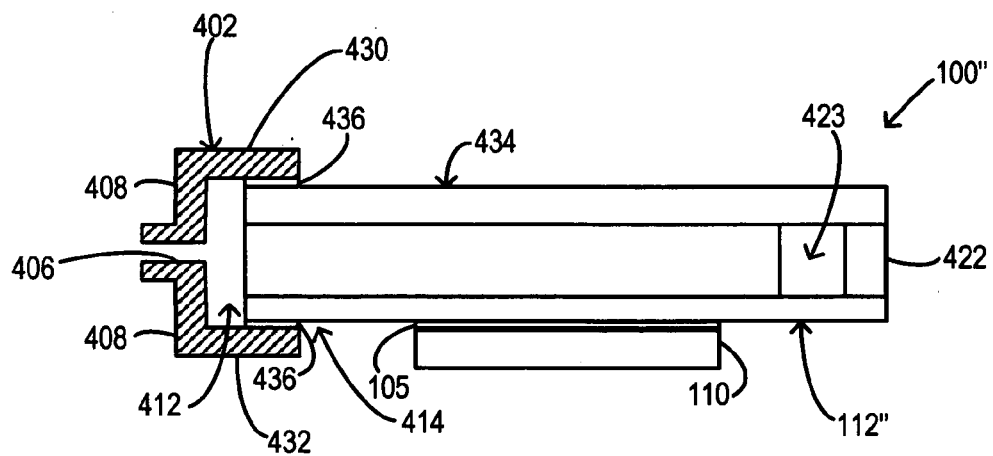
FIG. 6 is a schematic vertical cross-sectional view of the microchannel assembly of FIG. 5, taken at line VI-VI in FIG. 5.

In other embodiments, illustrated in FIGS. 5 and 6, a microchannel assembly 100" may have only a single manifold member 402, as in the embodiments of FIGS. 3 and 4, but the inlet port 404 and the outlet port 406, formed in the main side wall 408 of the manifold member 402, may be horizontally spaced from each other, as seen in the horizontal cross-sectional view of FIG. 5, rather than being spaced vertically from each other, as in the embodiment of FIGS. 3 and 4 (see the vertical cross-sectional view of FIG. 3).

Referring to FIG. 5, the manifold member 402 may include a plurality of walls, including main side wall 408, to define both an inlet manifold 410 and an outlet manifold 412, both manifolds 410, 412 being at the front end 414 of the microchannel structure 112". The inlet manifold is in communication with a first subset 416 (FIG. 5) of the microchannels 114 formed in the microchannel structure 112". The outlet manifold 412 is in communication with a second subset 418 of the microchannels 114 formed in the microchannel structure 112", with the second subset being all of the microchannels that are not in the first subset 416.

The microchannel structure 112" is closed at its rear end 420 by the rear wall 422 of the microchannel structure 112". The rear wall 422 is spaced from the microchannels 114 to form an intermediate manifold 423 at the rear end 420 of the microchannel structure 112". The intermediate manifold 423 is in communication with all of the microchannels 114. (As before, it will be noted that the rear end 420 is opposite to the front end 414 of the microchannel structure 112".)

The plurality of walls which constitute the manifold member 402 includes (in addition to the main side wall 408), a left side wall 424 (FIG. 5), a right side wall 426, and a dividing wall 428 which defines a boundary between the inlet manifold 412 and the outlet manifold 414 (and which isolates the inlet port 404 from the outlet port 406). All of these walls are vertical walls. Also, the manifold member 420 includes a top wall 430 (FIG. 6) and a bottom wall 432, both of which are horizontal walls.

Each of the inlet port 404 and the outlet port 406 may be integrally formed in the main side wall 408, or may be formed by molding the main side wall 408 around a suitable fitting, which is not separately shown. The inlet port 404 is positioned to allow coolant to flow into the inlet manifold 410, and may be configured to facilitate connection of a coolant line (not shown in FIG. 5) which transports coolant from a pump (not shown) to the microchannel assembly 100". The outlet port 406 is positioned to allow coolant to flow out of the outlet manifold 412, and may be configured to facilitate connection to a coolant line (not shown in FIGS. 5 and 6) which transports coolant from the microchannel assembly 100" to the heat exchanger (not shown).

The manifold member 402 may be coupled to the microchannel structure 112" and/or to a lid 434 (FIG. 6) via liquid-tight sealing arrangements as indicated at 436 and 438. As in the previous embodiments, the sealing arrangement at 436 may be an O-ring, solder or an epoxy adhesive, for example. The sealing arrangement at 438 may, for example, be formed of solder or an epoxy adhesive.

In some embodiments, the manifold member 402 may be formed as a single unitary body, formed for example of a metal such as copper, or silicon or molded plastic.

The operation of a cooling system that includes the microchannel assembly 100" may be generally the same as the operation described above in regard to the microchannel assembly 100, except that the flow of coolant into, through and out of the microchannel assembly 100" is somewhat different (and is also different from the flow through the microchannel assembly 100'). Referring to FIG. 5, the coolant flows through the inlet port 404 from an inflow coolant line (not shown) that is coupled to the inlet port 404. The flow of coolant into the inlet port is in the horizontal direction indicated by arrow 440. The coolant enters the inlet manifold 410 from the inlet port 404 and is distributed among the microchannels of the first subset 416. The coolant flows through the microchannels of the first subset in the same direction indicated by the arrow 440. While continuing to flow in the same direction, the coolant exits from the microchannels of the first subset at the rear end 420 of the microchannel structure 112" and enters the intermediate manifold 423. The coolant flows through the intermediate manifold 423 from the microchannels of the first subset 416 to the microchannels of the second subset 418, and flows through the microchannels of the second subset in a horizontal direction that is opposite to the direction indicated by arrow 440. The coolant flows out of the microchannels of the second subset and into the outlet manifold 412. From the outlet manifold 412, the coolant flows out of the outlet port 406, in the direction indicated by arrow 442, which is the same direction in which the coolant flowed from the rear end of the microchannel structure through the microchannels of the second subset. The coolant is transported away from the outlet port 406 via an outflow coolant line (not shown) that is coupled to the outlet port 406.

Figure 7:
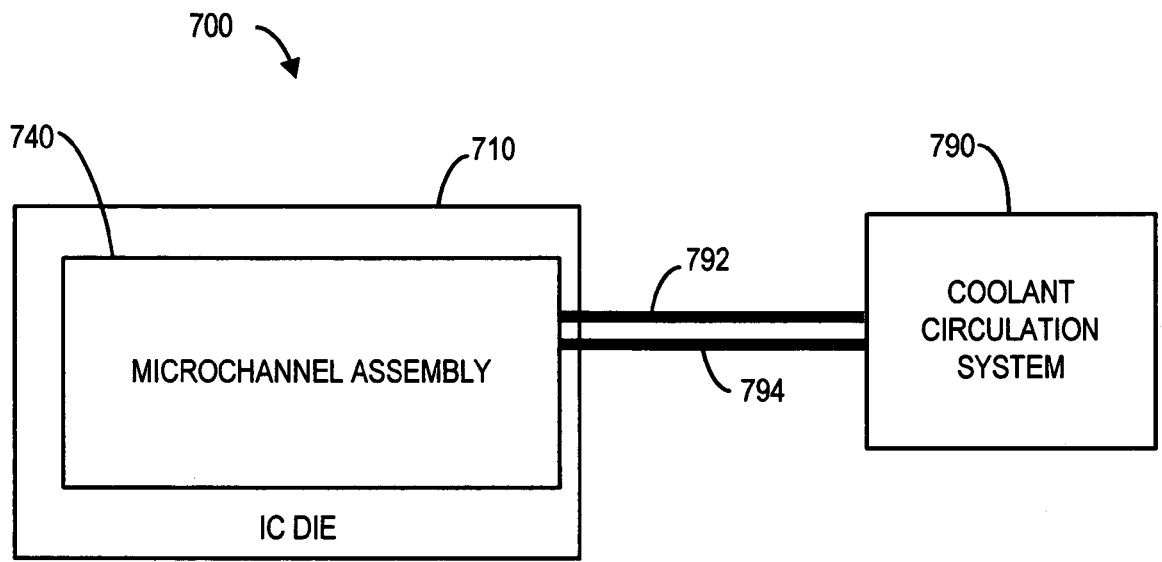
FIG. 7 is a block diagram showing a die with additional components of a cooling system according to some embodiments.

FIG. 7 is a block diagram showing an IC die 710 and additional components of a cooling system 700. For purposes of illustration the microchannel assembly 740 (which may be any one of the microchannel assemblies described above) is shown as a single block. The cooling system 700 includes a coolant circulation system 790 to supply the coolant to the microchannel assembly 740. The coolant circulation system 790 may be in fluid communication with the microchannel assembly 740 via one or more coolant supply channels or lines 792 and one or more coolant return channels 794. Although not separately shown, a pump and a heat exchanger located remotely from the die 710 may be included in the coolant circulation system 790.

Coolant supplied by the coolant circulation system 790 may flow through the microchannels of the microchannel assembly 740 at or above the rear surface of the IC die 710 to aid in cooling the IC die 710. In some embodiments, the coolant is operated with two phases—liquid and vapor. That is, in some embodiments at least part of the coolant in the microchannels is in a gaseous state. In other embodiments, the coolant is single phase—that is, all liquid.

Figure 8:
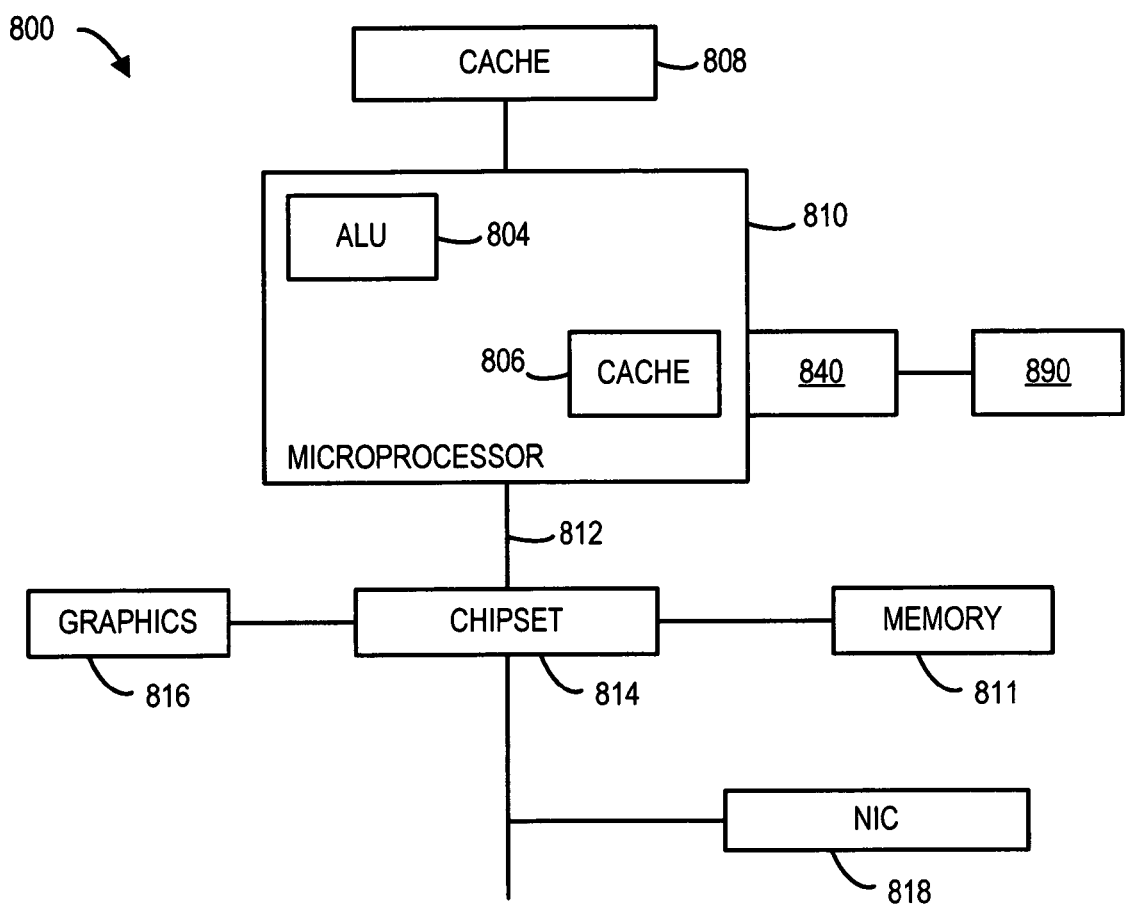
FIG. 8 is a block diagram of a computer system according to some embodiments that includes an example of an integrated circuit die associated with a cooling system as in one or more of FIGS. 1-7.

The IC die 710 may be associated with a microprocessor in some embodiments. FIG. 8 is a block diagram of a system 800 in which such a die 810 may be incorporated. In particular, the die 810 includes many sub-blocks, such as an Arithmetic Logic Unit (ALU) 804 and an on-die cache 806. The microprocessor on die 810 may also communicate to other levels of cache, such as off-die cache 808. Higher memory hierarchy levels, such as system memory 811, may be accessed via a host bus 812 and a chipset 814. In addition, other off-die functional units, such as a graphics accelerator 816 and a Network Interface Controller (NIC) 818, to name just a few, may communicate with the microprocessor on die 810 via appropriate busses or ports.

The IC die 810 may be cooled in accordance with any of the embodiments described herein. For example, a pump 890 may circulate a coolant (e.g., including water) through a cold plate 840 proximate to the IC die 810 and having at least one microchannel to transport the coolant. The cold plate 840 may be constructed in accordance with any of the embodiments of microchannel assemblies described above.

The system architecture shown in FIG. 8 is exemplary; other system architectures may be employed.

The several embodiments described herein are solely for the purpose of illustration. The various features described herein need not all be used together, and any one or more of those features may be incorporated in a single embodiment. Therefore, persons skilled in the art will recognize from this description that other embodiments may be practiced with various modifications and alterations.

What is claimed is:

1. An apparatus comprising:
  a microchannel structure having microchannels formed therein, said microchannels to transport a coolant and to be proximate to an integrated circuit to transfer heat from the integrated circuit to the coolant; and
  a plurality of walls coupled to the microchannel structure to define a manifold that is in communication with at least a plurality of said microchannels, said plurality of walls including a side wall, said side wall having a port therein, said port for allowing coolant to flow in a direction out of said manifold;
  wherein:
    said direction is parallel to a direction in which said coolant flows through said microchannels; and
    said coolant passes through said manifold after passing through said microchannels and before passing through said port.

2. The apparatus of claim 1, wherein said plurality of walls is included in a member formed as a unitary body.

3. An apparatus comprising:
  a microchannel structure having microchannels formed therein, said microchannels to transport a coolant and to be proximate to an integrated circuit to transfer heat from the integrated circuit to the coolant; and
  a plurality of walls coupled to the microchannel structure to define a manifold that is in communication with at least a plurality of said microchannels, said plurality of walls including a side wall, said side wall having a first port therein and a second port therein, said first port for allowing coolant to flow out of said manifold and out of said first port;
  said manifold being open to all of said microchannels at a first end of said microchannel structure;
  said second port to allow coolant to flow to a second end of said microchannel structure that is opposite said first end;
  wherein said first port extends outwardly from said side wall in a direction that is the same as a direction in which said second port extends outwardly from said side wall.

4. The apparatus of claim 3, wherein said plurality of walls includes a horizontal wall to isolate said second port from said first port.

5. A system comprising:
  a microprocessor integrated circuit die;
  a network controller coupled to the microprocessor;
  a microchannel structure thermally coupled to the microprocessor integrated circuit die, the microchannel structure having microchannels formed therein, said microchannels to transport a coolant; and
  a plurality of walls coupled to the microchannel structure to define a manifold that is in communication with at least a plurality of said microchannels, said plurality of walls including a side wall, said side wall having a port therein, said port for allowing coolant to flow in a direction out of said manifold;
  wherein:
    said direction is parallel to a direction in which said coolant flows through said microchannels; and
    said coolant passes through said manifold after passing through said microchannels and before passing through said port.

6. The system of claim 5, wherein said plurality of walls is included in a member formed as a unitary body.

7. A system comprising:
  a microprocessor integrated circuit die;
  a network controller coupled to the microprocessor;
  a microchannel structure thermally coupled to the microprocessor integrated circuit die, the microchannel structure having microchannels formed therein, said microchannels to transport a coolant; and
  a plurality of walls coupled to the microchannel structure to define a manifold that is in communication with at least a plurality of said microchannels, said plurality of walls including a side wall, said side wall having a first port therein and a second port therein, said first port for allowing coolant to flow out of said manifold and out of said first port;
  said manifold being open to all of said microchannels at a first end of said microchannel structure;
  said second port to allow coolant to flow to a second end of said microchannel structure that is opposite said first end;
  wherein said first port extends outwardly from said side wall in a direction that is the same as a direction in which said second port extends outwardly from said side wall.

* * * * *